United States Patent [19]
Hong

[11] Patent Number: 5,902,124
[45] Date of Patent: May 11, 1999

[54] DRAM PROCESS

[75] Inventor: Gary Hong, Hsin-Chu, Taiwan

[73] Assignee: United Microelectronics Corporation, Hsin-Chu, Taiwan

[21] Appl. No.: 08/924,548

[22] Filed: Aug. 27, 1997

Related U.S. Application Data

[60] Provisional application No. 60/047,835, May 28, 1997.

[51] Int. Cl.$^6$ .............................................. H01L 21/8242
[52] U.S. Cl. .......................................... 438/255; 438/665
[58] Field of Search .................................... 438/253, 254, 438/255, 396, 397, 398, 665, 964

[56] References Cited

U.S. PATENT DOCUMENTS

| | | | |
|---|---|---|---|
| 5,082,797 | 1/1992 | Chan et al. | 438/255 |
| 5,110,752 | 5/1992 | Lu | 438/255 |
| 5,340,765 | 8/1994 | Dennison et al. | 438/964 |
| 5,663,090 | 9/1997 | Dennison et al. | 438/665 |
| 5,837,579 | 11/1998 | Huang | 438/255 |

*Primary Examiner*—Chandra Chaudhari
*Attorney, Agent, or Firm*—Rabin & Champagne, P.C.

[57] ABSTRACT

A high capacitance DRAM structure is provided for a capacitor over bit line DRAM structure. A planarized dielectric layer is provided over the transfer FETs and the bit line contact of a COB structure. A silicon nitride layer is provided over the planarized dielectric layer to serve as an etch stop for a subsequent wet etching process. A first sacrificial oxide layer is deposited over the silicon nitride etch stop layer and then contacts are opened through the various dielectric layers to the appropriate source/drain regions of the transfer FETs. A first polysilicon layer is deposited within the capacitor contact openings and over the first sacrificial oxide layer. A second sacrificial oxide layer is provided and openings are formed in the second sacrificial oxide layer substantially centered over the capacitor contacts. A second polysilicon layer is provided over the second sacrificial oxide layer and in contact with the first polysilicon layer. The lateral extent of polysilicon fins is defined using conventional photolithography and etching on the second polysilicon layer, the second sacrificial oxide layer and the first polysilicon layer in sequence. A wet etch is used to remove the remaining portions of the second sacrificial oxide layer and the first sacrificial oxide layer. The surfaces of the resulting polysilicon fins may be covered with hemispherical grained polysilicon to further increase their surface area. A capacitor dielectric is provided over the fins and an upper capacitor electrode is formed to complete the charge storage capacitor.

19 Claims, 5 Drawing Sheets

DRAM PROCESS

This application claims priority from provisional application Ser. No. 60/047,835, filed May 28, 1997, now abandoned.

BACKGROUND OF THE INVENTION

1. Field of the Invention

The present invention relates to the formation of capacitors for integrated circuit memories and more particularly to methods of forming high capacitance structures in a high volume manufacturing environment.

2. Description of the Related Art

In dynamic random access memories (DRAMs), information is typically stored by selectively charging or discharging each capacitor of an array of capacitors formed on the surface of a semiconductor substrate. Most often, a single bit of binary information is stored at each capacitor by associating a discharged capacitor state with a logical zero and a charged capacitor state with a logical one (or vice versa). The surface area of the electrodes of the memory capacitors determines the amount of charge that can be stored on each of the capacitors for a given operating voltage, for the electrode separation that can reliably be manufactured, and for the dielectric constant of the capacitor dielectric used between the electrodes of the charge storage capacitor. Read and write operations are performed in the memory by selectively coupling the charge storage capacitor to a bit line to either transfer charge to or from the charge storage capacitor. The selective coupling of the charge storage capacitor to the bit line is typically accomplished using a transfer field effect transistor (FET). The bit line contact is made to one of the source/drain electrodes of the transfer FET and the charge storage capacitor is typically formed in contact with the other of the source/drain electrodes of the transfer FET. Word line signals are supplied to the gate of the FET to connect one electrode of the charge storage capacitor through the transfer FET to the bit line contact, facilitating the transfer of charge between the charge storage capacitor and the bit line.

There is a continuing trend toward increasing the storage density of integrated circuit memories to provide increased quantities of data storage on a single chip. Higher density memories provide storage that is generally more compact and is often cheaper on a per bit basis than an equivalent amount of storage provided on plural chips. It has generally been possible to provide these higher levels of storage at equivalent or improved levels of performance as compared to the earlier, less dense memory chips. Historically, the density of integrated circuit devices has been increased in part by decreasing the size of structures such as wiring lines and transistor gates as well as by decreasing the separation between the structures that make up the integrated circuit device. Reducing the size of circuit structures is generally referred to as decreasing the "design rules" used for the manufacture of the integrated circuit device.

Applying reduced design rules to a DRAM reduces the substrate surface area that can be devoted to the charge storage capacitor of the DRAM. Thus, applying reduced design rules to conventional planar capacitor designs reduces the amount of charge (i.e., capacitance) that can be stored on the charge storage capacitor. Reducing the amount of charge on the capacitor leads to a variety of problems, including the potential loss of data due to greater susceptibility to decay mechanisms and to charge leakage. This greater susceptibility to charge loss may cause the DRAM to require more frequent refresh cycles, which are undesirable since the memory may be unavailable for data storage and readout transactions during refresh activities. In addition, reduced levels of charge storage might require more sophisticated data readout schemes or more sensitive charge sensing amplifiers. Thus, modern DRAMs require increased levels of capacitance in reduced substrate area DRAM cells. To this end, a variety of very complex capacitor structures having three dimensional charge storage surfaces have been proposed. In general, these complex capacitor structures are difficult to manufacture. This is particularly true when the requirements are taken into account for forming such capacitor structures in a high throughput manufacturing environment in a manner compatible with high yields. It is accordingly an object of the present invention to provide a capacitor structure that is more compatible with a high volume manufacturing environment.

SUMMARY OF THE PREFERRED EMBODIMENTS

According to a first aspect of the invention, a DRAM is formed on a substrate having transfer FETs formed in and on the surface of the substrate, where the transfer FETs each have first source/drain regions that serve as contacts for charge storage capacitors. A dielectric layer is provided over the substrate and an etch stop layer is provided over the dielectric layer. A first sacrificial layer is provided over the etch stop layer and then etching is performed through the first sacrificial layer, the etch stop layer and the first dielectric layer to form capacitor contact openings which expose the first source/drain regions. Vertical conductors are provided within the contact openings and a first conductive layer is provided over the first sacrificial layer so that the vertical conductors connect the first conductive layer to the first source/drain regions. The first conductive layer is patterned to laterally define the first conductive layer into first conductive fins and then the first sacrificial layer is removed from below the first conductive fins in a process that stops on and exposes the etch stop layer. A capacitor dielectric layer is provided over the first conductive fins and an upper capacitor electrode is provided on the capacitor dielectric layer.

According to another aspect of the invention, a DRAM is formed on a substrate having transfer FETs formed in and on the surface of the substrate, where the transfer FETs each have first source/drain regions that serve as contacts for charge storage capacitors. A dielectric layer is provided over the substrate and an etch stop layer is provided over the dielectric layer. A first oxide layer is provided over the etch stop layer and then etching is performed through the first oxide layer, the etch stop layer and the first dielectric layer to form capacitor contact openings which expose the first source/drain regions. Vertical conductors are provided within the contact openings and a first polysilicon layer is provided over the first oxide layer so that the vertical conductors connect the first polysilicon layer to the first source/drain regions. A second oxide layer is provided on the first polysilicon layer and the second oxide layer is patterned to form openings which expose portions of the first polysilicon layer. A second polysilicon layer is provided over the second oxide layer and in contact with the first polysilicon layer. The first and second polysilicon layers are patterned to laterally define first conductive fins from the first polysilicon layer and second conductive fins from the second polysilicon layer. The first and second oxide layers are removed to expose surfaces of the first and second conductive fins in a process which stops on the etch stop layer. A capacitor dielectric layer is provided over the first and second conductive fins and an upper capacitor electrode is provided on the capacitor dielectric layer.

DETAILED DESCRIPTION OF THE PREFERRED EMBODIMENTS

Figure 1:
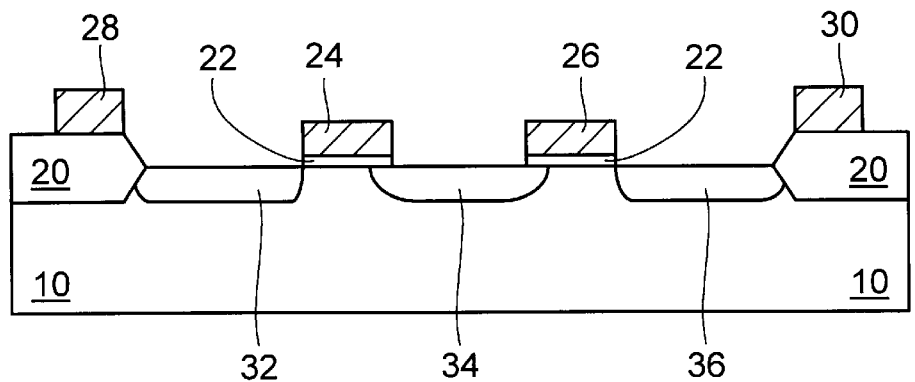
FIGS. 1–10 illustrate steps in the manufacture of a DRAM in accordance with preferred aspects of the present invention.

Preferred embodiments of the present invention provide a high capacitance DRAM charge storage capacitor using methods compatible with high volume manufacture. A high capacitance DRAM capacitor electrode structure is provided for a capacitor over bit (COB) line DRAM structure. A dielectric layer is provided over the transfer FETs and the bit line contact of a COB structure. A silicon nitride layer is provided over the planarized dielectric layer to serve as an etch stop for a subsequent wet etching process. A first sacrificial oxide layer is deposited over the silicon nitride etch stop layer and then contacts are opened through the various dielectric layers to the appropriate source/drain regions of the transfer FETs. A first polysilicon layer is deposited within the capacitor contact openings and over the first sacrificial oxide layer. A second sacrificial oxide layer is provided over the first polysilicon layer and openings are formed in the second sacrificial oxide layer substantially centered over the capacitor contacts. A second polysilicon layer is provided over the second sacrificial oxide layer and in contact with the first polysilicon layer within the openings in the second sacrificial oxide layer. The lateral extent of polysilicon fins is defined using conventional photolithography and etching on the second polysilicon layer, the second sacrificial oxide layer and the first polysilicon layer in sequence. A wet etch is used to remove the remaining portions of the second sacrificial oxide layer and the first sacrificial oxide layer. The surfaces of the resulting polysilicon fins may be covered with hemispherical grained polysilicon to further increase their surface area. A capacitor dielectric layer is provided over the fins and an upper capacitor electrode is formed to complete the DRAM charge storage capacitor.

Manufacture of a DRAM in this manner provides a device that has a high level of capacitance using a comparatively simple process for the capacitance provided by the structure. Features are provided on the DRAM capacitor that are smaller than the photolithography resolution limit in two different ways. First, the horizontal fins of the bottom electrode are separated by the thickness of an oxide or other deposited layer. Thicknesses of such layers can be controllably made much smaller than the resolution of conventional photolithography processes and equipment used so that the horizontal fins typically have a thickness and separation less than the photolithography resolution limit. Secondly, a layer of hemispherical grained polysilicon, which can have feature sizes on the order of approximately 100 nanometers, is deposited and etched back to produce a more rugged surface on the bottom electrode. The surface texture provided to the bottom capacitor electrode in this way has a dimension much smaller than present resolution limits. The processes used in these steps are well understood and have high yields. As such, it is to be expected that DRAM's formed in accordance with this process can be manufactured with comparatively high yields. Further discussion of these aspects and other preferred aspects of the present invention is now presented with specific reference to FIGS. 1–10.

Formation of a dynamic random access memory (DRAM) in accordance with preferred embodiments of the present invention begins on a P-type silicon substrate 10. FIG. 1 illustrates a substrate 10 having device isolation structures 20 formed on its surface and with a gate oxide layer 22 covering portions of the active device regions of the substrate. The device illustrated in FIG. 1 incorporates field oxide regions 20 formed by a local oxidation of silicon (LOCOS) method but might also be formed as shallow trench isolation regions filled with CVD oxide. Transfer FETs are formed on the active device region in the conventional fashion. Typically, a polysilicon layer is deposited over the gate oxide layer 22 on the substrate and patterned to define polysilicon gate electrodes 24, 26 and wiring lines 28, 30. The polysilicon may be doped either in situ during deposition or by ion implantation and annealing of the blanket deposited polysilicon layer before patterning or at some later point in processing. N-type source/drain regions 32, 34 and 36 are provided in the substrate 10 on either side of gate electrodes 24, 26. In some embodiments, it may be preferred to provide a lightly doped drain (LDD) structure for each of the source/drain regions 32, 34, 36 illustrated in FIG. 1. Presently, however, it is more desirable to provide a uniformly doped N-type region for each of the source/drain regions 32, 34, 36.

It is typically preferred to provide protective dielectric layers around the gate electrodes 24, 26 and the wiring lines 28, 30 to protect these conductors during subsequent processing and to reduce the possibility of undesired contacts being formed to the conductors 24, 26, 28, 30. Consequently, it is typical to provide oxide layers over the gate electrodes 24, 26 and wiring lines 28, 30. Typically, oxide layers are provided over the blanket deposited polysilicon layer prior to the patterning steps used to define the gate electrodes and wiring lines. Alternate materials such as silicon nitride or an oxynitride might be provided as the capping, protective dielectric layer over the gate electrodes and wiring lines. It is also desirable to form protective dielectric layers on the sides of gate electrodes 24, 26 and wiring lines 28, 30. In some cases, oxide spacer structures are formed on the sides of the gate electrodes and wiring lines in the process of forming a lightly doped drain (LDD) structure for the source/drain regions of the transfer FET. In those embodiments where an LDD structure is formed for the source/drain regions, the oxide spacer structures are typically left in place during subsequent processing. In those presently preferred embodiments of the present invention in which a constant doping is at least initially provided to at least the source/drain regions 32, 36 on which the lower capacitor electrodes will be formed, oxide spacer structures are preferably formed alongside the gate electrodes and wiring lines to protect those conductors and to prevent shorts later in processing. Oxide spacer structures may be formed by providing a blanket oxide layer by chemical vapor deposition (CVD) to a thickness approximately equal to the width desired for the oxide spacer structures, for example, about 1000–2000 Å. An anisotropic etch back process using, for example, an etchant derived from a plasma source incorporating a $CF_4$ or other fluorine bearing source gas may be used to form the illustrated oxide spacer structures.

Figure 2:
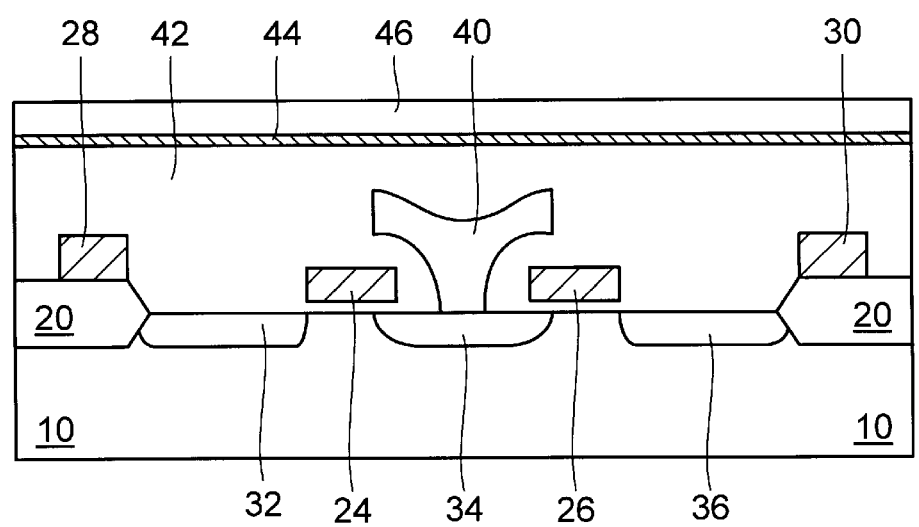

After the transfer FET and wiring lines are defined, the bit line contact is formed for the preferred capacitor over bit line (COB) structure of a DRAM according to the present invention. Typically, an additional oxide layer is deposited by CVD over the FIG. 1 structure to provide additional protection for the source/drain regions 32, 36 to which the capacitor electrodes will be connected. In some embodiments, it might be suitable to provide an etch stop layer different from silicon oxide over the source/drain regions 32, 36 and the gate electrodes 24, 26. Providing such an etch stop layer is particularly preferred when a large thickness of oxide must be etched through to expose the source/drain regions 32, 36 when defining the capacitor electrode contacts. If, on the other hand, the improvement in yield associated with using the etch stop layer does not justify the added cost of the additional deposition process and additional etching process, then an etch stop layer might not be used. An opening is formed through the oxide layer to expose the common source/drain region 34 that serves as the common bit line contact for the two illustrated DRAM cells. A layer of polysilicon is deposited by low pressure chemical vapor deposition (LPCVD) in contact with source/drain region 34. The bit line contact polysilicon is preferably doped in situ during deposition by the addition of phosphine ($PH_3$) gas to the silane deposition gas during the LPCVD process. The bit line contact polysilicon is patterned to define a bit line contact 40, as shown in FIG. 2. Next, a thick layer of dielectric material 42 is provided over the transfer FETs and the bit line contact structure 40. A suitable dielectric material for layer 42 is a CVD boron phosphorus silicate glass (BPSG). Layer 42 is deposited to a sufficient thickness to be planarized and yet still provide a sufficiently thick layer of dielectric material over the bit line contact 40 and other structures to allow for good process margins. Layer 42 might in fact consist of multiple layers of dielectric material if a reflow or etch back planarization process is used. In the illustrated preferred embodiment, however, layer 42 is a single layer of BPSG that is planarized using chemical mechanical polishing (CMP). Planarization of layer 42 allows subsequent processing steps to be performed with much higher accuracy. In addition, for the particular capacitor structure discussed below, a planarized working surface on dielectric layer 42 is generally desirable to achieve acceptable levels of yield from the DRAM manufacturing process.

The lateral fins of the preferred lower capacitor electrode of the present invention are defined by etching to remove a horizontally extending sacrificial dielectric layer from between adjacent layers of polysilicon. Most preferably, the sacrificial dielectric layer is removed in a wet etching process to facilitate high throughput and high yields. To accommodate this particularly preferred wet etching process, it is preferred that the interlayer dielectric layer 42 be covered by a layer of an etch stop material 44. The etch stop layer 44 should be a dielectric since it will extend between different lower capacitor electrodes, and most preferably the etch stop layer 44 is sufficiently different from the material used in defining the capacitor electrode superstructure to allow layer 44 to function as an effective etch stop during the preferred wet etching process. In most cases, the sacrificial dielectric layer used to define the superstructure of the capacitor electrode is chosen to be an oxide because of the high speed with which oxide layers can be deposited. For those preferred embodiments that utilize sacrificial oxide layers in forming the capacitor electrode superstructure, an appropriate etch stop layer 44 can be formed from silicon nitride. The preferred silicon nitride layer 44 can be deposited by CVD to a thickness of 100–1000 Å, ensuring that a sufficient thickness of silicon nitride is present to protect the dielectric layer 42 while minimizing the thickness of the silicon nitride etch stop layer due to the comparatively slow deposition rate for silicon nitride.

Next, a first layer of sacrificial dielectric material is deposited over the etch stop layer 44. The layer 46 is chosen to be the same as other sacrificial layers deposited subsequently in defining the capacitor electrode superstructure. Most preferably, layer 46 is chosen to have a relatively high deposition rate and to be easily etched using a wet etchant. As such, layer 46 is desirably silicon oxide deposited by CVD to a thickness of 1000–3000 Å. Contact openings are now formed through layers 46, 44 and 42 to expose source/drain regions 32, 36 to which the lower capacitor electrodes will be connected. The etching process may be performed in a commercially available TEL oxide etcher. The initial or main etch of the capacitor contact openings is performed using, for example, an etchant derived in a plasma process from a $C_2F_6$ source gas. This etching process is continued to expose the surface of the source/drain regions 32, 36. It has been observed that this main etching process is often inadequate to complete the etching process in that there will be polymers, oxide or other materials left contaminating the surfaces of the source/drain regions 32, 36. Consequently, a finishing etch is performed using the less selective source gas $CF_4$ to remove polymers and other materials from the surface of the source/drain regions 32, 36. The structure with etched capacitor contact openings is illustrated in FIG. 3.

Figure 3:
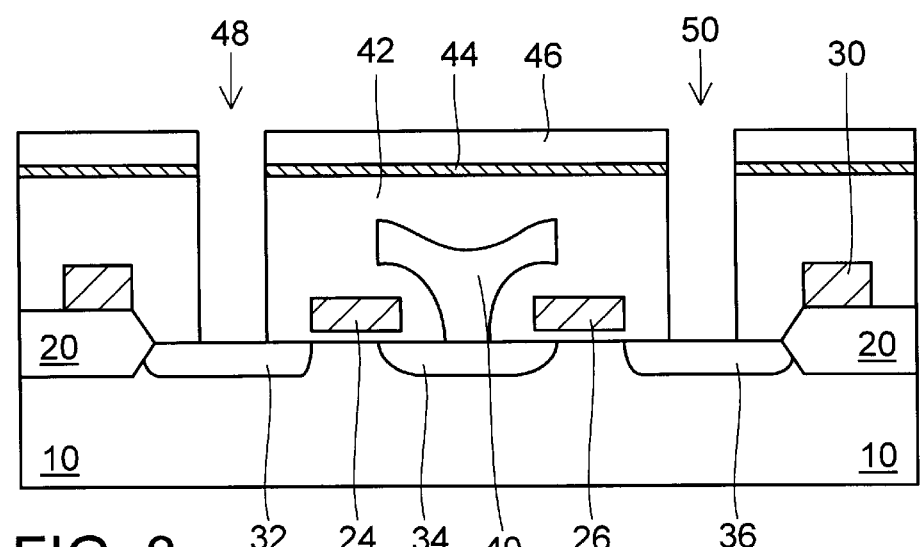
Figure 4:
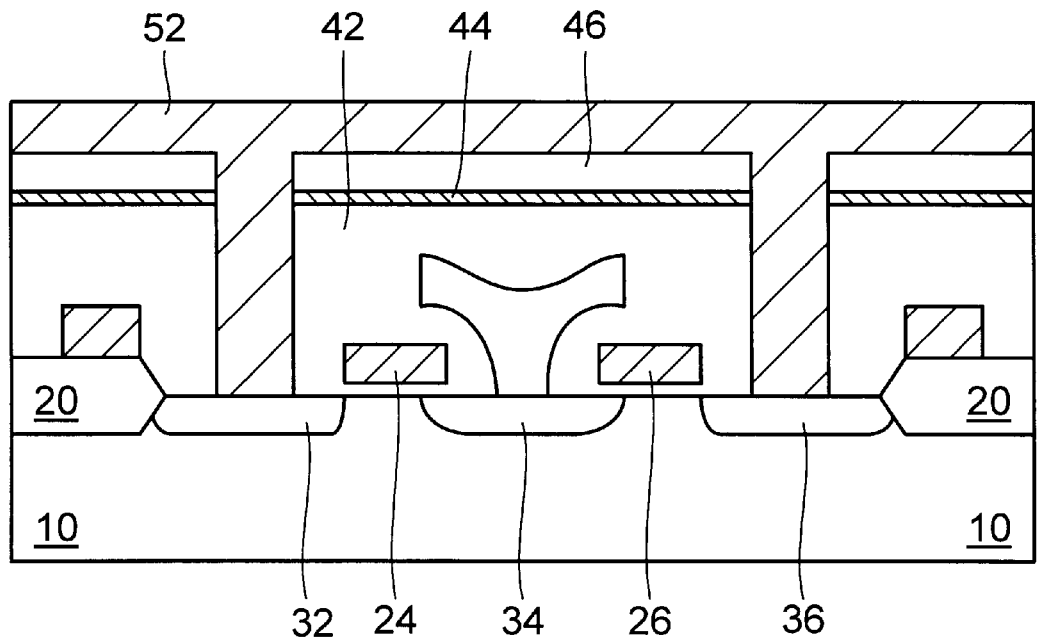

Referring now to FIG. 4, a layer of polysilicon 52 is deposited over the FIG. 3 structure so that the polysilicon fills the capacitor contact openings and covers surfaces of the sacrificial oxide layer 46. It may be desirable to planarize the surface of the polysilicon layer 52 either in an etch back process or chemical mechanical polishing (CMP) process, if necessary. Such a planarization process is, of course, only desirable if it is effective in improving yields by a meaningful amount. It is particularly preferred that the polysilicon layer 52 be doped in situ by adding phosphine to the deposition gases. This is so for two reasons. First, the capacitor contact openings extend a considerable distance through layers 46, 44 and 42 so that, if polysilicon layer 52 were doped by ion implantation and diffusion, too long of a heating process would be necessary to achieve good conductivity at surfaces of source/drain regions 32, 36. Secondly, by doping polysilicon layer 52 in situ, the amount of dopants that might diffuse from the polysilicon layer 52 into the source/drain regions 32, 36 is reduced. Of course, to take advantage of this aspect of in situ doping, it is desirable to minimize the number of subsequent high temperature processing steps in which dopants could diffuse from the polysilicon layer 52 into the source/drain regions 32, 36.

Figure 5:
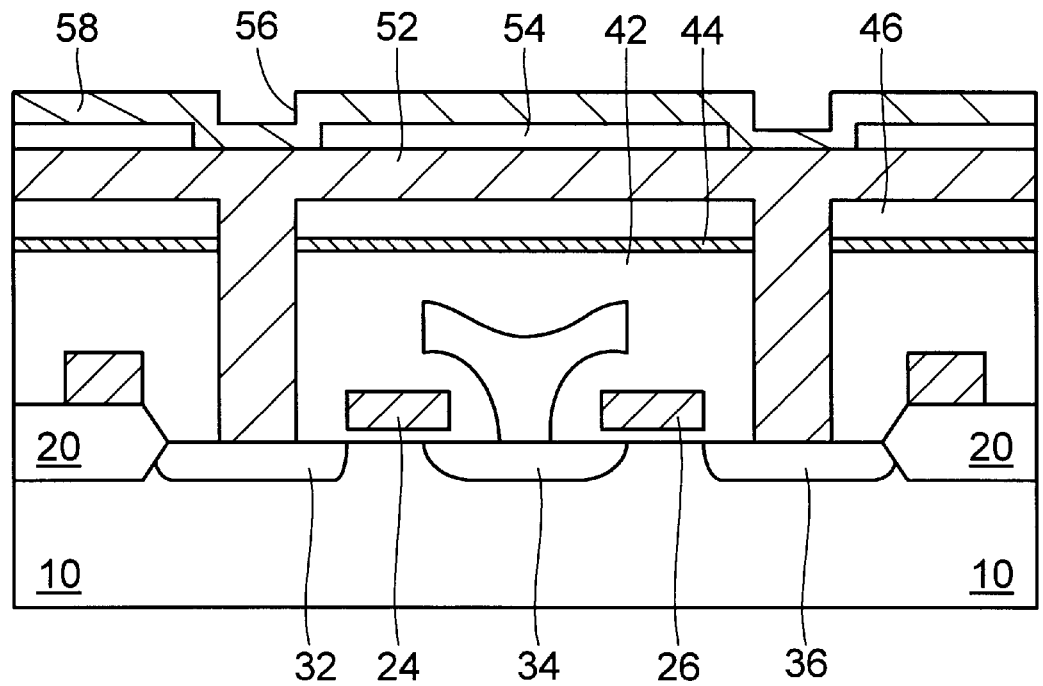

Processing continues on the FIG. 4 structure to form additional superstructure for the lower capacitor electrodes. A second sacrificial oxide layer 54 is deposited to a thickness of between about 1000–3000 Å over the surface of polysilicon layer 52. A conventional photoresist mask is provided over the second sacrificial oxide layer 54, with openings in the mask substantially centered over the vertically extending portions of polysilicon layer 52 that make contact with the source/drain regions 32, 36. The portions of the second sacrificial oxide layer exposed within the mask are etched to expose the polysilicon layer 52. The photoresist mask is then stripped, preferably by ashing. As illustrated in FIG. 5, portions of the second sacrificial oxide layer remain on the rest of the surface of the polysilicon layer 52. The openings through the remaining portions of the second sacrificial oxide layer 54 are preferably small, since they will define in part the allowable lateral extent of the second fins on the lower capacitor electrode. Another layer of polysilicon is deposited over the second sacrificial oxide layer 54. The polysilicon layer 58 extends within the openings 56 in the oxide layer 54 to provide electrical contact between polysilicon layer 58 and polysilicon layer 52. As before, it is preferred that polysilicon layer 58 be doped in situ to minimize dopant diffusion into and from source/drain regions 32, 36. The process of forming sacrificial oxide layers having openings substantially centered over the vertically extending portions of polysilicon layer 52 followed by deposition of a doped polysilicon layer might be repeated to further increase the capacitance of the DRAM capacitor. Such additional sequences are not illustrated or described herein, since the process flow described to this point adequately illustrates the additional process steps required for forming additional laterally extending thin structures.

Figure 6:
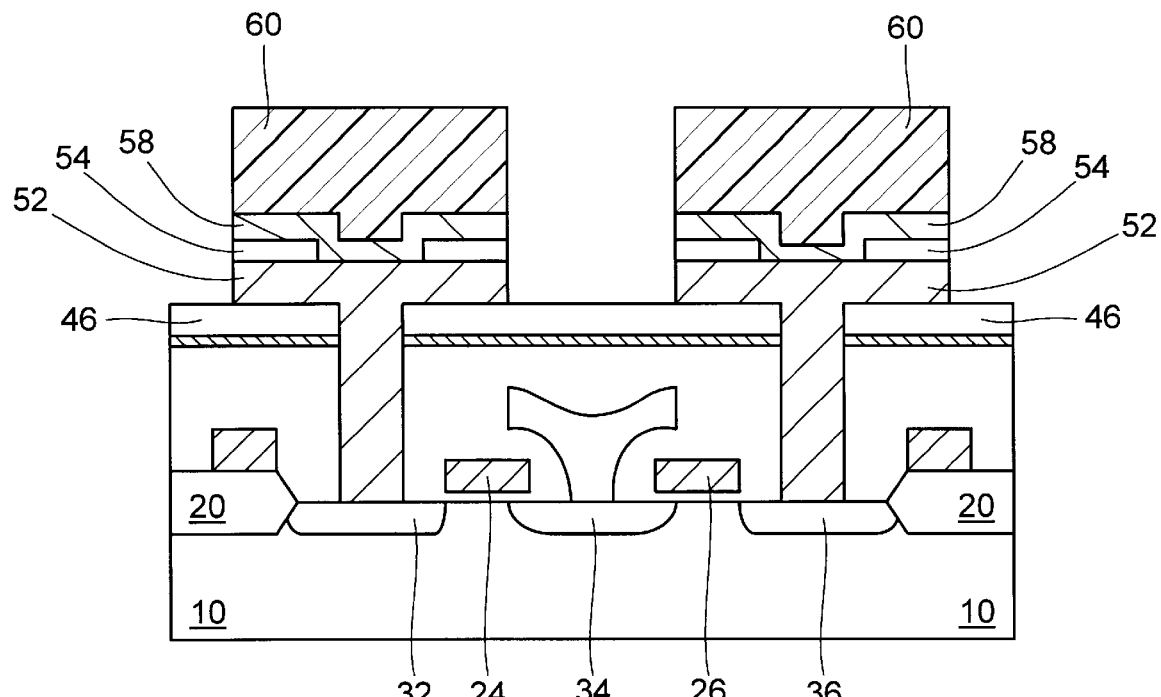

A photoresist mask 60 as illustrated in FIG. 6 is provided on the surface of polysilicon layer 58. The photoresist mask 60 has openings over portions of the polysilicon and sacrificial oxide layer structure to be removed to laterally define the lower capacitor electrodes. The photoresist mask provides portions of photoresist over the vertically extending portions of polysilicon layer 52 to ensure that the etched superstructure will be in contact with the source/drain regions 32, 36 as appropriate to the DRAM structure. Polysilicon layer 58 is etched anisotropically using, for example, an anisotropic polysilicon etchant derived in a plasma process from HBr and HCl source gases. The exposed portion of the second sacrificial oxide layer 54 is then etched using, for example, an etchant derived in a plasma process from a $C_2F_6$ source gas and then the polysilicon layer 52 is etched through using the same anisotropic polysilicon etchant. The resulting structure is illustrated in FIG. 6. The photoresist mask is then stripped, preferably before the subsequent wet etchant process.

Figure 7:
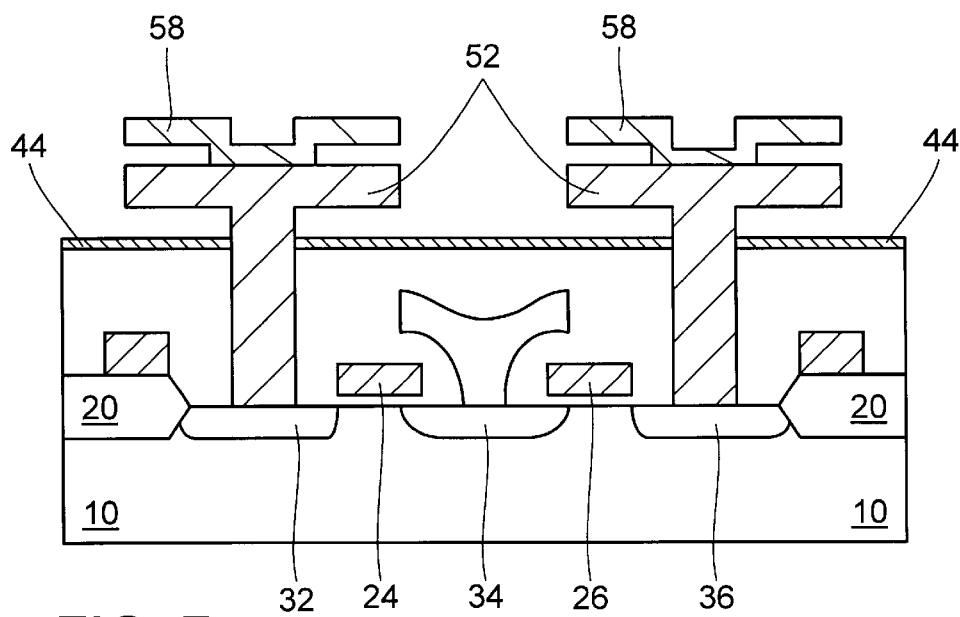
Figure 8:
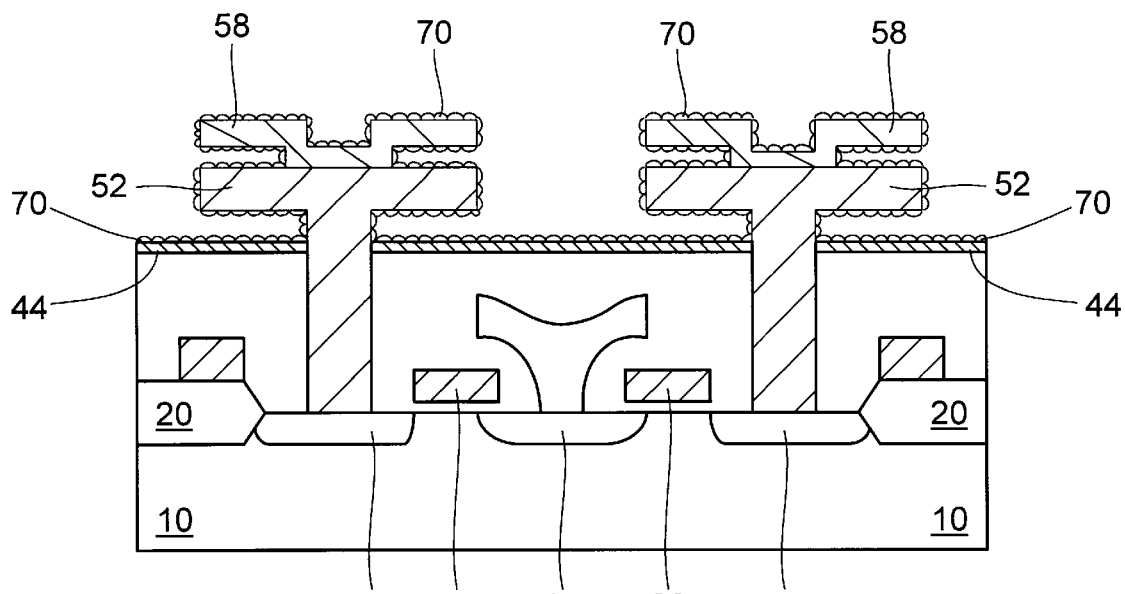

A wet etching process is then performed to remove the sacrificial oxide layers 54, 56 from between the polysilicon fin structures 52, 58 and from below the lower polysilicon fins 52. A preferred etchant might be a dilute solution of HF or a buffered oxide etch (BOE). Such etchants efficiently remove silicon oxide without substantially etching polysilicon. This etch process thus exposes the surfaces of the polysilicon fin structures 52, 58 and stops on the silicon nitride etch stop layer 44, as shown in FIG. 7. The finned lower capacitor electrode superstructure shown in FIG. 7 has significantly increased surface area for the storage of charge as compared to simple planar or crown charge storage capacitor electrode structures. This increased surface area can be further improved by forming a rugged or textured surface on the polysilicon fins 52, 58.

A layer of hemispherical grained polysilicon (HSG—Si) may be formed on the exposed surfaces of polysilicon fin structures 52, 58. It is preferred that a HSG—Si growth process be initiated on a clean silicon surface by cleaning native oxide from the surface of the polysilicon fins 52, 58 before depositing the HSG—Si. A distinct cleaning step may be unnecessary if the growth of the HSG—Si layer is initiated immediately after etching exposes the underlying layer of polysilicon, if the surface of the underlying polysilicon layer is maintained in a sufficient vacuum to prevent oxide growth. More practically, it is to be expected that there will be a time interval between the etching of the underlying polysilicon layer and the initiation of HSG—Si growth. Accordingly, the surface of the underlying polysilicon layer is preferably cleaned before the initiation of HSG—Si growth. Native oxides may be cleaned from the surface of polysilicon by a variety of techniques, including HF dip, spin-etching using HF, vapor HF cleaning, or by an $H_2$ plasma cleaning. Preferably, the surface of the underlying polysilicon layer is hydrogenated as a result of the cleaning operation, because the hydrogenated surface serves to protect the polysilicon surface from reoxidation. Each of the cleaning techniques listed above will achieve the desired hydrogenation of the polysilicon surface. After cleaning, a layer of HSG—Si 70 is formed on the surface of the polysilicon fin structures 52, 58 and over the silicon nitride etch stop layer 44. The layer 70 may be formed in any of the well-known methods and may be formed by depositing HSG—Si by LPCVD from silane source gas onto a substrate held at a temperature of between 555° C. to 595° C. The resulting structure includes an irregular surface of HSG—Si due to the largely random nature of the nucleation of HSG—Si growth. Growth of a layer of HSG—Si on the surface of conventional polysilicon has been observed to provide distinct grains having sizes on the order of 100 nanometers or smaller. When incorporated within DRAM capacitors, such HSG—Si layers have been observed to increase capacitance by approximately a factor of 1.8 times over the capacitance provided by the smooth surface of the conventional polysilicon layer.

Figure 9:
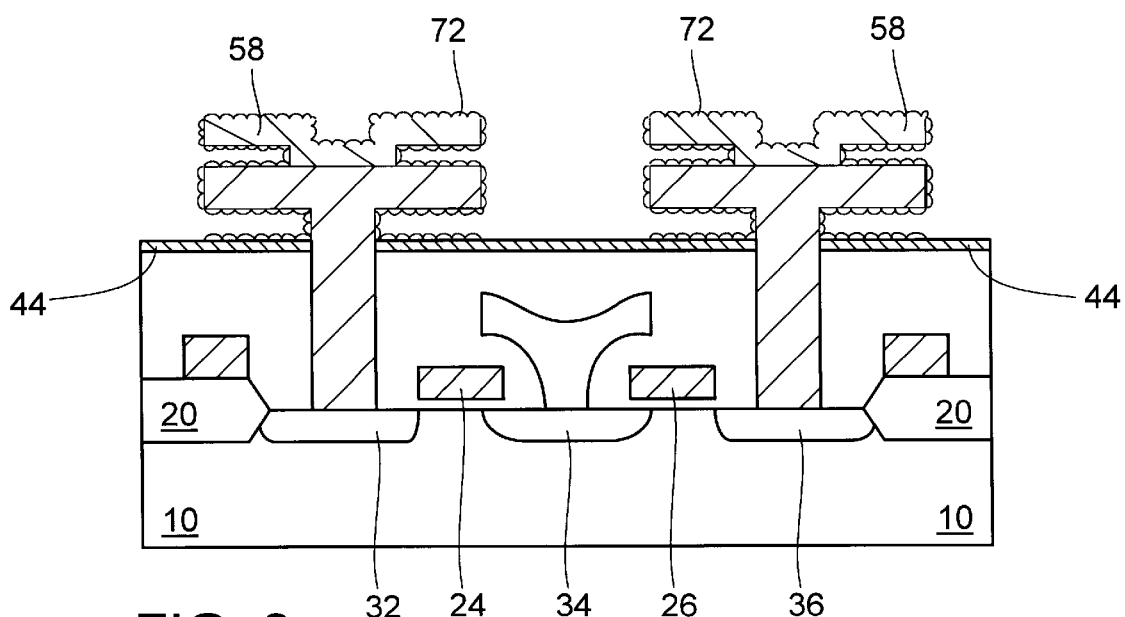
Figure 10:
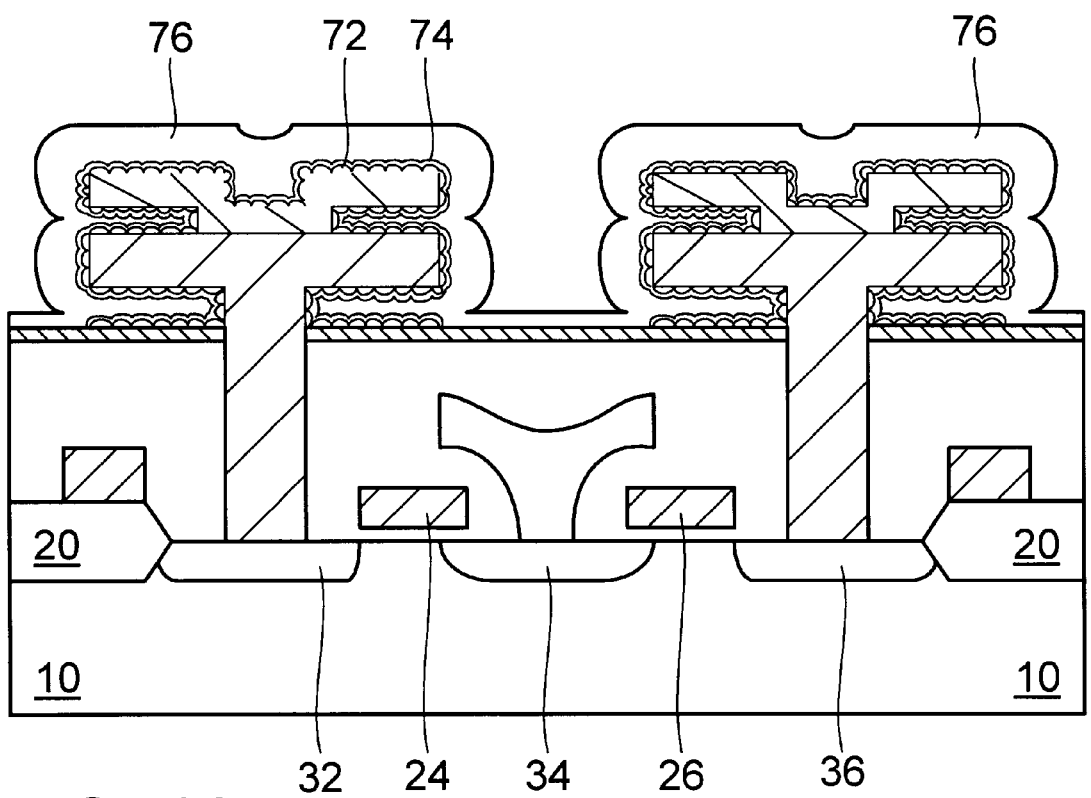

Next, an etch back process is performed to remove the portions of the HSG—Si layer 70 deposited between the different lower capacitor electrodes. This etch back process might be performed using, for example, an anisotropic etchant such as that derived in a plasma process from a mixture of HCl and HBr source gases. Most preferably, the etch back process also removes the HSG—Si layer 70 from the upper surface of the upper polysilicon fin 58. In this way, a surface 72 having the roughness characteristics of HSG—Si is provided on the upper polysilicon fin 58 which has the more preferred conductivity and surface properties of polysilicon rather than the less preferred properties of HSG—Si. The completed lower capacitor electrode structure is illustrated in FIG. 9. A capacitor dielectric layer 74 is then provided over the rugged surface of the polysilicon lower electrode structures. Various capacitor dielectrics are known and include, for example, the multilayer oxide/nitride/oxide dielectric typically referred to as "ONO." Such a structure may be formed by allowing a native oxide layer to grow over the rugged polysilicon surface, depositing a thin layer of silicon nitride by chemical vapor deposition and then oxidizing a thin portion of the nitride surface in a thermal oxidation process to complete the ONO capacitor dielectric 74. More preferably, the lowest oxide layer of the ONO structure is suppressed to form an "NO" capacitor dielectric. Still more preferable is the use of a higher dielectric constant material such as $Ta_2O_5$ or one of the perovskite dielectrics such as barium strontium titanate. Next, an upper capacitor plate 76 is formed over the bottom capacitor electrodes by blanket LPCVD of polysilicon, preferably doped in situ during deposition or less preferably by ion implantation doping and annealing. The upper capacitor electrode is patterned and further processing is performed to complete the DRAM device.

While the present invention has been described in terms of certain preferred embodiments thereof, those of ordinary skill in the art will appreciate that various modifications might be made to the embodiments described herein without altering the fundamental teachings of the present invention. As such, the present invention is not to be limited to the particular specific embodiments described. Rather, the scope of the present invention is to be determined from the claims which follow.

What is claimed:

1. A method of forming a DRAM comprising:
   providing a substrate having transfer FETs formed in and on the surface of the substrate, the transfer FETs each having first source/drain regions that serve as contacts for charge storage capacitors;

providing a dielectric layer over the substrate and the transfer FETs;

providing an etch stop layer over the dielectric layer;

providing a first sacrificial layer over the etch stop layer;

etching through the first sacrificial layer, the etch stop layer and the first dielectric layer to form capacitor contact openings which expose the first source/drain regions;

providing vertical conductors within the contact openings and providing a first conductive layer over the first sacrificial layer, the vertical conductors connecting the first conductive layer to the first source/drain regions;

patterning the first conductive layer to laterally define the first conductive layer into first conductive fins;

removing the first sacrificial layer from below the first conductive fins in a process that stops on and exposes the etch stop layer;

providing a capacitor dielectric layer over the first conductive fins; and providing an upper capacitor electrode on the capacitor dielectric layer.

2. The method of claim 1, further comprising the steps of:

providing a second sacrificial layer on the first conductive layer;

patterning the second sacrificial layer to form openings which expose portions of the first conductive layer;

providing a second conductive layer over the second sacrificial layer and in contact with the first conductive layer;

patterning the second conductive layer to define the second conductive layer into second conductive fins; and removing the second sacrificial layer from between the second conductive fins and the first conductive fins.

3. The method of claim 2, wherein the openings in the second sacrificial layer are disposed over the capacitor contact openings.

4. The method of claim 2, wherein the first and second conductive layers comprise polysilicon and the first and second sacrificial layers comprise an oxide.

5. The method of claim 3, wherein the steps of removing the first sacrificial layer and of removing the second sacrificial layer are performed in a single wet etching process.

6. The method of claim 5, wherein the single wet etching process is performed with an etchant comprising HF.

7. The method of claim 2, further comprising the step of forming a textured surface over the surfaces of the first and second polysilicon fins.

8. The method of claim 7, wherein the steps of forming a forming a textured surface comprises depositing hemispherical grained polysilicon over surfaces of the first and second polysilicon fins.

9. The method of claim 8, wherein the hemispherical grained polysilicon is also deposited on the etch stop layer, the method further comprising the step of etching back the hemispherical grained polysilicon to expose the surface of the etch stop layer.

10. The method of claim 9, wherein the step of etching back the hemispherical grained polysilicon completely removes the hemispherical grained polysilicon from an upper surface of the second polysilicon fin.

11. The method of claim 2, further comprising the step of planarizing the dielectric layer before providing the etch stop layer over the dielectric layer.

12. The method of claim 11, wherein the first sacrificial layer is removed in a wet etching process.

13. The method of claim 12, wherein the first sacrificial layer and the dielectric layer are both oxides and wherein the etch stop layer is silicon nitride.

14. A method of forming a DRAM comprising:

providing a substrate having transfer FETs formed in and on the surface of the substrate, the transfer FETs each having first source/drain regions that serve as contacts for charge storage capacitors;

providing a dielectric layer over the substrate and the transfer FETs;

providing an etch stop layer over the dielectric layer;

providing a first oxide layer over the etch stop layer;

etching through the first oxide layer, the etch stop layer and the first dielectric layer to form capacitor contact openings which expose the first source/drain regions;

providing vertical conductors within the contact openings and providing a first polysilicon layer over the first sacrificial layer, the vertical conductors connecting the first polysilicon layer to the first source/drain regions;

providing a second oxide layer on the first polysilicon layer;

patterning the second oxide layer to form openings which expose portions of the first polysilicon layer;

providing a second polysilicon layer over the second oxide layer and in contact with the first polysilicon layer;

patterning the first and second polysilicon layers to laterally define first conductive fins from the first polysilicon layer and second conductive fins from the second polysilicon layer;

removing the first and second oxide layers to expose surfaces of the first and second conductive fins in a process which stops on the etch stop layer;

providing a capacitor dielectric layer over the first and second conductive fins; and providing an upper capacitor electrode on the capacitor dielectric layer.

15. The method of claim 14, wherein the step of removing the first and second oxide layers comprises a single wet etching process.

16. The method of claim 15, wherein the single wet etching process is performed with an etchant comprising HF.

17. The method of claim 14, further comprising the step of planarizing the dielectric layer before providing the etch stop layer over the dielectric layer.

18. The method of claim 17, wherein the etch stop layer is silicon nitride.

19. The method of claim 14, wherein the first and second polysilicon layers are deposited by CVD and are doped by adding dopants to CVD source gases during deposition.

* * * * *